(12) United States Patent
Stamper et al.

(10) Patent No.: US 11,469,178 B2
(45) Date of Patent: Oct. 11, 2022

(54) METAL-FREE FUSE STRUCTURES

(71) Applicant: GLOBALFOUNDRIES U.S. Inc., Santa Clara, CA (US)

(72) Inventors: Anthony K. Stamper, Burlington, VT (US); John J. Ellis-Monaghan, Grand Isle, VT (US); Steven M. Shank, Jericho, VT (US); John J. Pekarik, Underhill, VT (US); Vibhor Jain, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/126,921

(22) Filed: Dec. 18, 2020

(65) Prior Publication Data
US 2022/0199525 A1   Jun. 23, 2022

(51) Int. Cl.
*H01L 23/525* (2006.01)
*H01L 27/12* (2006.01)
*H01L 23/532* (2006.01)

(52) U.S. Cl.
CPC .... *H01L 23/5256* (2013.01); *H01L 23/53271* (2013.01); *H01L 27/1203* (2013.01)

(58) Field of Classification Search
CPC ........... H01L 23/5256; H01L 23/53271; H01L 27/1203; H01L 23/5258; H01L 23/5252; H01L 27/10894
USPC .......................... 257/529, 530; 438/131, 132
See application file for complete search history.

(56) References Cited

U.S. PATENT DOCUMENTS

| | | | |
|---|---|---|---|
| 6,682,959 B2 | 1/2004 | Bang et al. | |
| 7,981,732 B2 | 7/2011 | Badami et al. | |
| 8,105,886 B2 | 1/2012 | Otsuka et al. | |
| 8,294,239 B2 | 10/2012 | Min | |
| 8,723,154 B2 | 5/2014 | Jo et al. | |
| 9,685,958 B2 | 6/2017 | Bhunia et al. | |
| 10,095,889 B2 | 10/2018 | Pedersen et al. | |
| 2011/0241124 A1* | 10/2011 | Kurz et al. | H01L 21/28518 257/379 |
| 2018/0286807 A1* | 10/2018 | Kitajima | H01L 23/5258 257/529 |

* cited by examiner

Primary Examiner — Thinh T Nguyen
(74) Attorney, Agent, or Firm — Anthony Canale; Andrew M. Calderon; Calderon Safran & Cole, P.C.

(57) ABSTRACT

The present disclosure relates to semiconductor structures and, more particularly, to a metal-free fuse structure and methods of manufacture. The structure includes: a first metal-free fuse structure comprising a top semiconductor material of semiconductor-on-insulator (SOI) technologies, the top semiconductor material including end portions with a first electrical resistance and a fuse portion of a second, higher electrical resistance electrically connected to the end portions; and a second metal-free fuse structure comprising the top semiconductor material of semiconductor-on-insulator (SOI) technologies, the top semiconductor material of the second metal-free fuse structure including at least a fuse portion of a lower electrical resistance than the second, higher electrical resistance.

20 Claims, 5 Drawing Sheets

METAL-FREE FUSE STRUCTURES

FIELD OF THE INVENTION

The present disclosure relates to semiconductor structures and, more particularly, to metal-free fuse structures and methods of manufacture.

BACKGROUND

Counterfeit chips have begun to enter the supply chain as the ability to reverse engineer chips has been perfected. These counterfeit chips are known to enter into the medical device supply chain, for example. Of course, counterfeit chips are also entering into a host of other supply chains. The counterfeit chips can cost the semiconductor industry billions of dollars per year.

To respond, manufacturers use e-fuses as a means for chip identification. In e-fuse technologies, metal lines are used to create fuse structures which can be blown in a certain sequence to create a unique identification for each chip. However, e-fuses using metal lines are not always practical as they require additional fabrication processes and additional costs, particularly in chips which do not already use the metal lines. In addition, the metal lines can take up valuable real estate on the chip, itself.

SUMMARY

In an aspect of the disclosure, a structure comprises: a first metal-free fuse structure comprising a top semiconductor material of semiconductor-on-insulator (SOI) technologies, the top semiconductor material including end portions with a first electrical resistance and a fuse portion of a second, higher electrical resistance electrically connected to the end portions; and a second metal-free fuse structure comprising the top semiconductor material of semiconductor-on-insulator (SOI) technologies, the top semiconductor material of the second metal-free fuse structure including at least a fuse portion of a lower electrical resistance than the second, higher electrical resistance.

In an aspect of the disclosure, a structure comprises: at least two metal-free wiring structures comprising a top semiconductor material of semiconductor-on-insulator substrate, the at least two metal-free wiring structures comprising end portions with a lower electrical resistance than a mid-portion.

In an aspect of the disclosure, a structure comprises: a first metal-free wiring structure comprising a top layer of semiconductor material of a semiconductor-on-insulator substrate, the first metal-free wiring structure comprising a first electrical resistance; and a second metal-free wiring structure composed of the top semiconductor material of the semiconductor-on-insulator substrate, the second metal-free wiring structure comprising a second electrical resistance less than the first electrical resistance.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
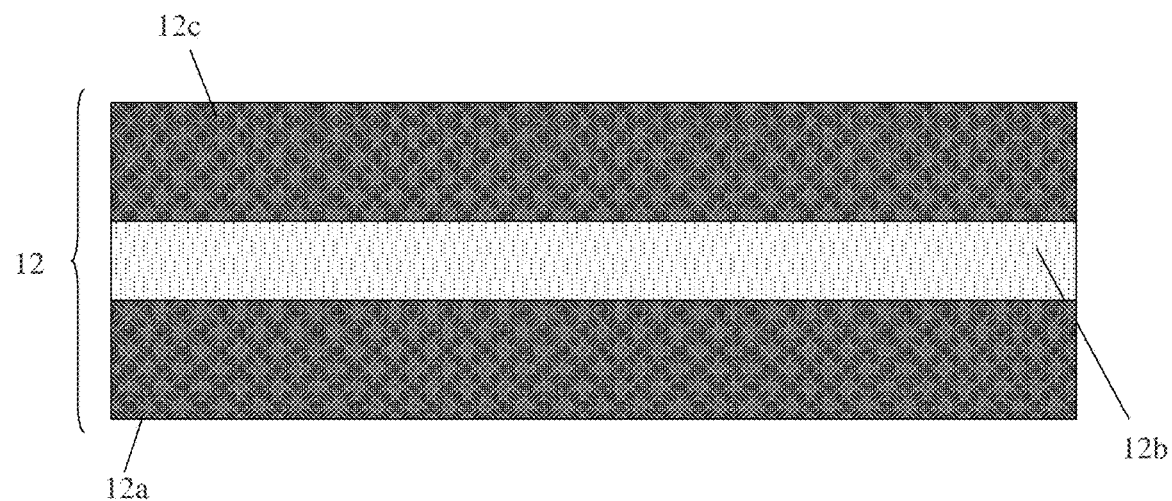
FIG. 1 shows a semiconductor-on-insulator (SOI) substrate in accordance with aspects of the present disclosure.

The present disclosure relates to semiconductor structures and, more particularly, to metal-free fuse structures and methods of manufacture. More specifically, the metal-free fuse structures comprise top semiconductor material fabricated over an insulator layer on a substrate. In embodiments, the top semiconductor layer comprises crystalline silicon, the insulator layer comprises buried oxide (BOX), e.g., $SiO_2$, and the substrate comprises amorphous, polysilicon, or crystalline silicon. The top semiconductor layer includes different electrical resistances along its length. Advantageously, the metal-free fuse structure provides tighter pitches, e.g., 10X tighter pitch than laser or metal line e-fuses, thereby reducing overall space used on a chip. In addition, the metal-free fuses eliminate the need of forming fuses from metals which are electromigrated to form a high resistance fuse link.

In embodiments, the metal-free fuse structures can be implanted with a noble gas, e.g., argon, Xe, Kr, etc., a semiconductor such as Si or Ge, or an oxidizer such as oxygen (O) to provide a high electrical resistance area. In further embodiments, the high electrical resistance area can comprise amorphous silicon, e.g., non-crystalline material, or crystalline Si material, depending on the required electrical resistance values of the metal-free fuse structure, amongst other features described herein. In further embodiments, the high electrical resistance area can be implanted with O to oxidize and increase its resistance. In further embodiments, the metal-free fuse structures can be ion implanted with a dopant to change the electrical resistance at different locations along the metal-free wiring structures.

In embodiments, the metal-free fuse structure can be front end of line (FEOL) or back end of line (BEOL) fuses, providing a unique identification which the end customer can measure/observe to identify chips. In this way, the metal-free fuse structure can be used to identify counterfeit chips and help with supply chain security, or provide a unique identifier for each chip which contains information about the starting wafer or chip location, amongst other features. For example, the metal-free fuse structures can be used to provide other information such as parametric test data.

The metal-free fuse structures of the present disclosure can be manufactured in a number of ways using a number of different tools. In general, though, the methodologies and tools are used to form structures with dimensions in the micrometer and nanometer scale. The methodologies, i.e., technologies, employed to manufacture the metal-free fuse structures of the present disclosure have been adopted from integrated circuit (IC) technology. For example, the structures are built on wafers and are realized in films or layers of material patterned by photolithographic processes on the top of a wafer. In particular, the fabrication of the metal-free fuse structures uses three basic building blocks: (i) forming thin films of material on a substrate, (ii) applying a patterned mask on top of the films by photolithographic imaging, and (iii) etching the films selectively to the mask.

FIG. 1 shows a starting structure comprising semiconductor-on-insulator (SOI) technologies in accordance with aspects of the present disclosure. More specifically, in FIG. 1 the SOI technology includes a handle wafer 12a, an insulator layer 12b and a top semiconductor material 12c. The insulator layer 12b comprises any suitable insulator material, preferably buried oxide material (BOX), e.g., $SiO_2$. Moreover, in embodiments, the handle wafer 12a and the semiconductor material 12c can comprise any suitable semiconductor material including, but not limited to, Si, SiGe, SiGeC, SiC, GaAs, InAs, InP, and other III/V or II/VI compound semiconductors. In embodiments the handle wafer can also comprise an insulator, such as $SiO_2$ or $Al_2O_3$. In preferred embodiments, the top semiconductor material 12c comprises single crystalline Si material in any suitable crystallographic orientation (e.g., a (100), (110), (111), or (001) crystallographic orientation).

Figure 2:
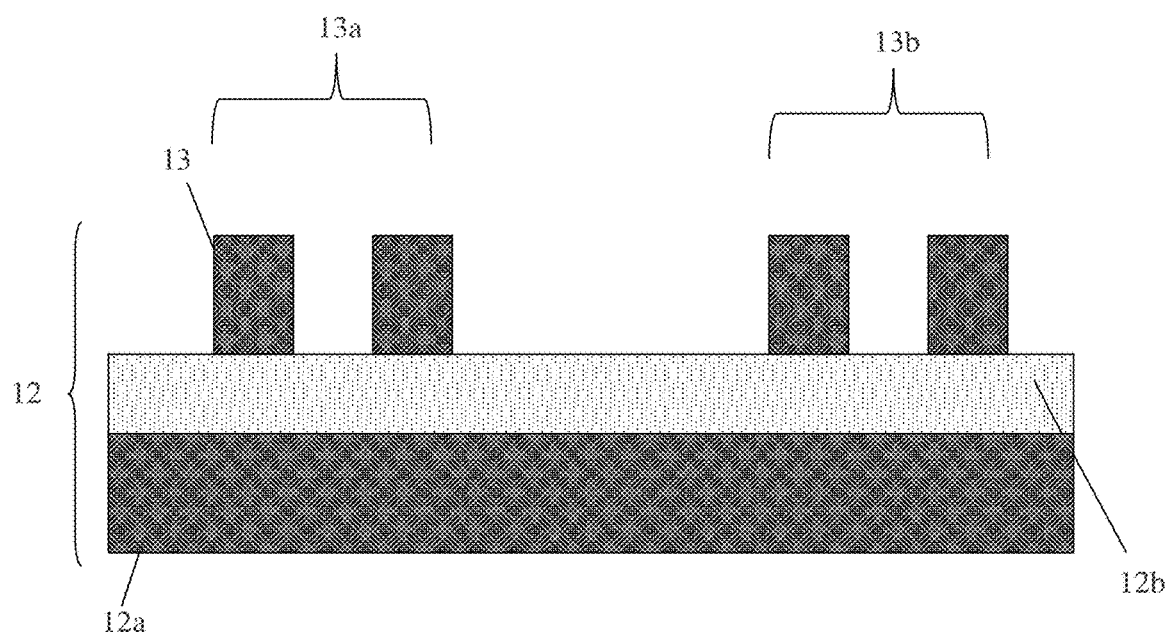
FIG. 2 shows a plurality of wiring structures patterned from top semiconductor material of the SOI substrate, and respective fabrication processes in accordance with aspects of the present disclosure.

FIG. 2 shows a plurality of wiring structures 13 patterned from the top semiconductor material 12c. In embodiments, the wiring structures 13 include SOI top silicon wiring structures in region 13a that may be used as fuses and SOI top silicon wiring structures in region 13b that may be used as active wiring structures. In embodiments, the wiring structures 13 are metal-free and can be formed by different patterning processes. For example, the patterning process can be electron-beam lithography (e-beam lithography) or conventional photolithography followed by etching processes.

In e-beam lithography, for example, a focused beam of electrons can be scanned to draw custom shapes on a surface of an electron-sensitive film, e.g., resist, which covers the top semiconductor material 12c. As is known in the art, the electron beam changes the solubility of the resist, enabling selective removal of either the exposed or non-exposed regions of the resist by immersing it in a solvent (developing). The pattern can then transferred to the top semiconductor material 12c by, for example, etching processes. In embodiments, the e-beam lithography can be used to draw custom wiring structures 13 in the sub-10 nm resolution (e.g., pitch). In photolithography, the photoresist changes the solubility of the resist, enabling selective removal of either the exposed or non-exposed regions of the resist by immersing it in a solvent (developing).

Figure 3A:
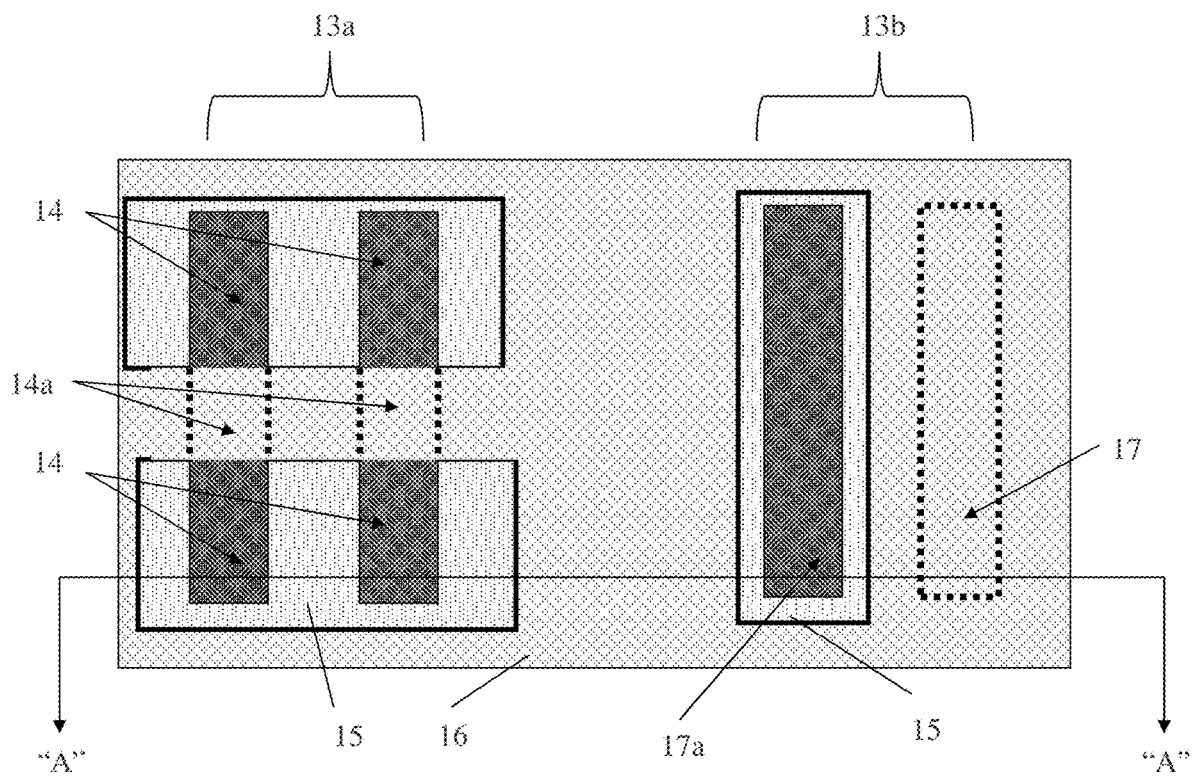
FIG. 3A shows a top view of an ion implantation mask formed over selected wiring structures of the plurality of wiring structures, amongst other features, and respective fabrication processes in accordance with aspects of the present disclosure.
Figure 3B:
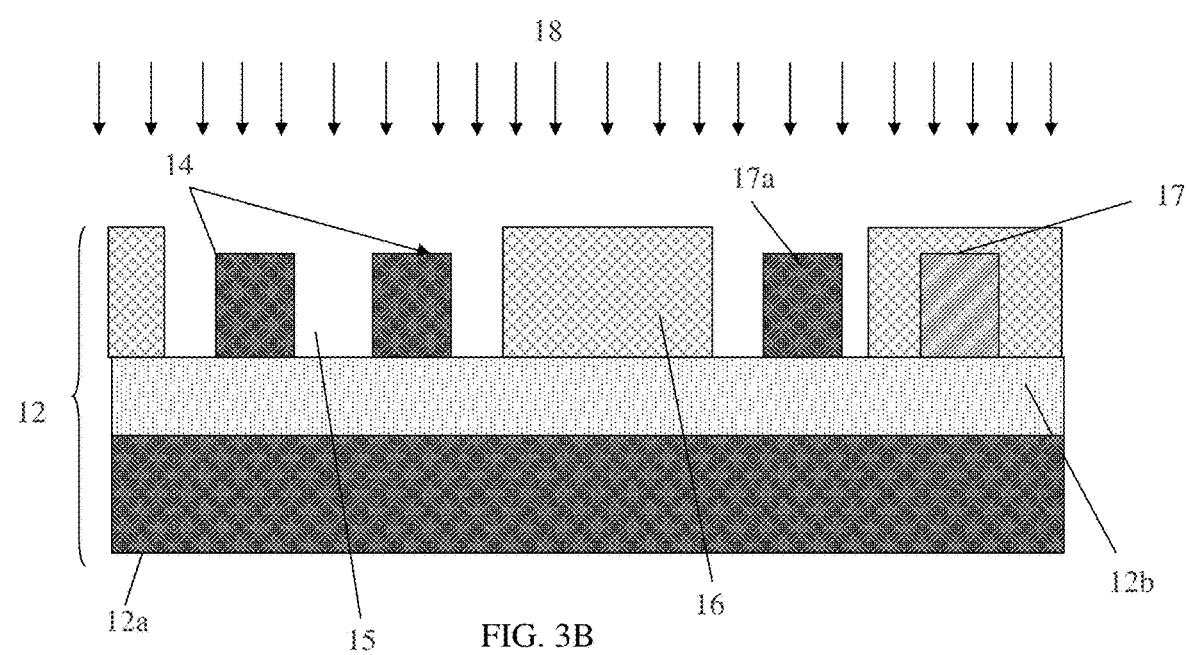
FIG. 3B shows a cross-sectional view of the ion implantation mask along line "A"-"A" of FIG. 3A.

FIG. 3A shows a top view of an optional ion implantation mask (e.g., resist mask) 16 with openings 15 formed over the plurality of wiring structures and FIG. 3B shows a cross-sectional view of the ion implantation mask 16 along line "A"-"A" of FIG. 3A. In embodiments, the ion implantation mask 16 can be patterned to include openings 15, exposing end portions 14 of wiring structures 13 in region 13a and active wiring structure 17a in region 13b. It should be understood, though, that the openings 15 can be provided at other locations and over other metal-free wiring structures.

The central portion 14a of the wiring structures 13 in region 13a and the active wiring structure 17 in region 13b remain protected by the implantation mask 16 during the ion implantation process. In this way, the exposed end portions 14 of the wiring structures 13 in region 13a and the active wiring structure 17a can undergo an ion implantation process that introduces a concentration of n-type or p-type dopant as shown by arrows 18. As should be understood by those of ordinary skill in the art, the doping process can be used to decrease the electrical resistance of the wiring structures 13a, 17a. For example, the dopant can be n-type As or p-type B, which, if activated by a dopant activation anneal, has lower resistivity than undoped semiconductor material, e.g., Si. In additional or alternative embodiments, the exposed end portions 14 of the wiring structures, e.g., 13 (including, e.g., wiring structure 17a) can have a silicide formed by known silicide processes. Silicide processes are known to those of ordinary skill in the art such that no further explanation is required for a complete understanding of the present disclosure.

In embodiments, the implantation mask 16 may include a layer of a light-sensitive material, such as an organic photoresist, applied by a spin coating process, pre-baked, exposed to light projected through a photomask, baked after exposure, and developed with a chemical developer. The implantation mask 16 has a thickness and stopping power sufficient to block masked areas 14a, 17 of the wiring structures against receiving a dose of the implanted ions. The dopants can be either p-type dopant, e.g., Boron (B), or n-type dopants, e.g., Arsenic (As), Phosphorus (P) and Sb, among other suitable examples. The implantation mask 16 is stripped after the implantation process.

Figure 4A:
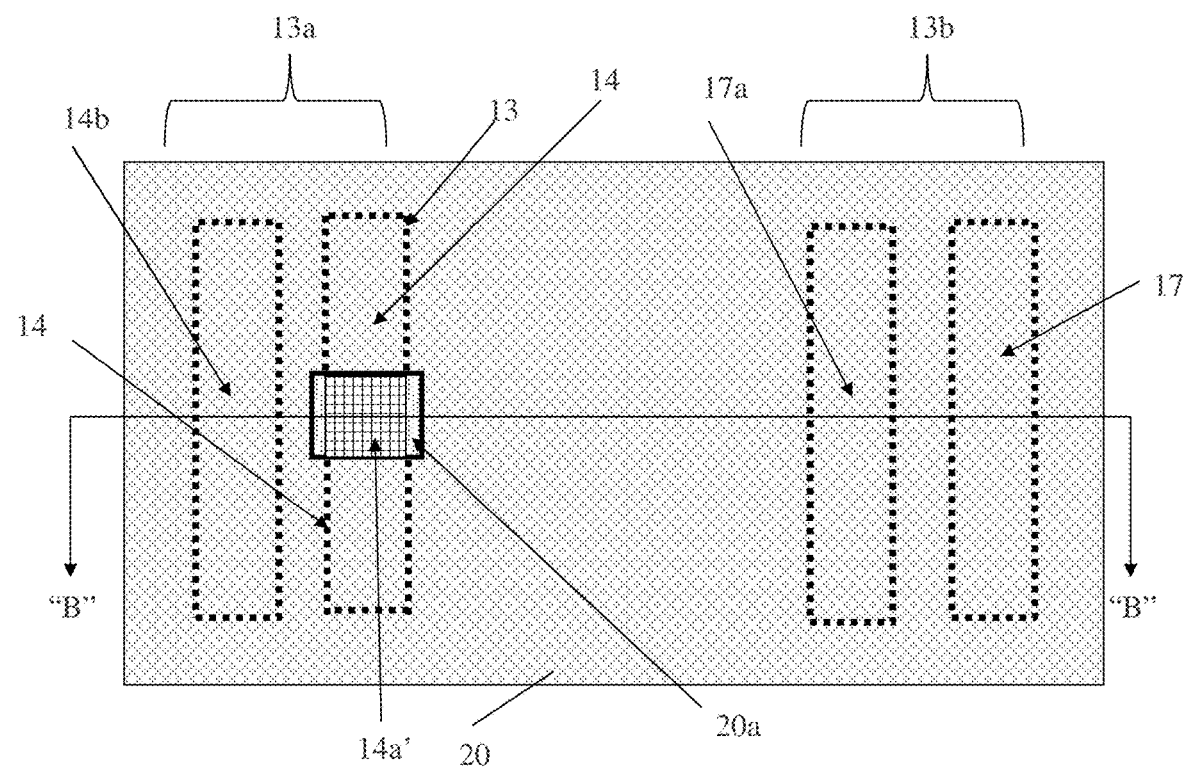
FIG. 4A shows a top view of a mask exposing a fuse portion of a selected wiring structure of the plurality of wiring structures, amongst other features, and respective fabrication processes in accordance with aspects of the present disclosure.
Figure 4B:
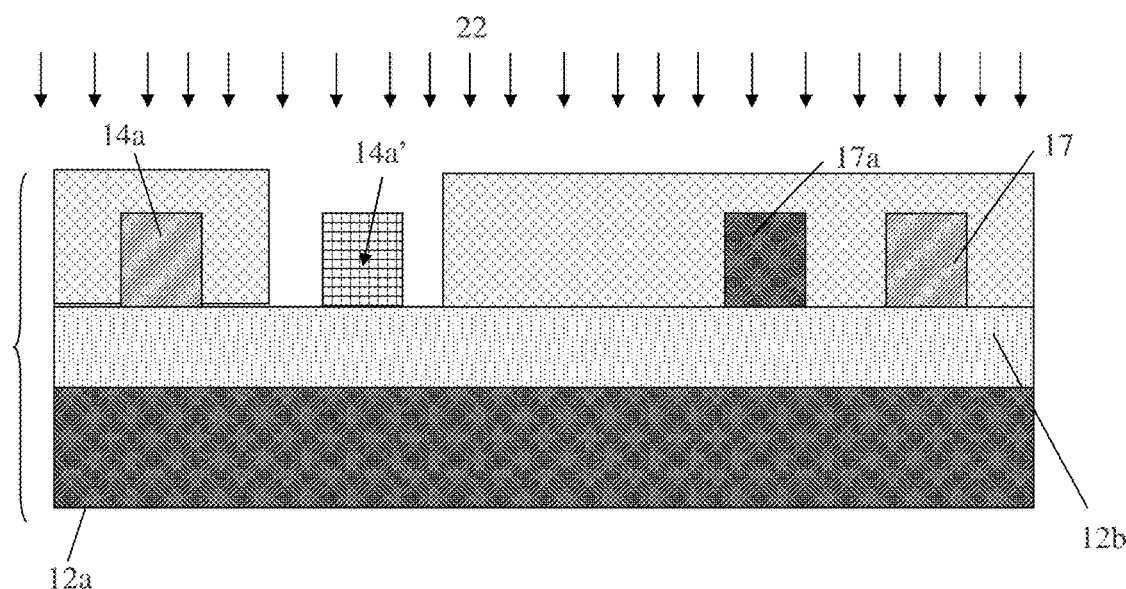
FIG. 4B shows a cross-sectional view of the mask, amongst other features, along line "B"-"B" of FIG. 4A.

FIG. 4A shows a top view of a mask 20 with a patterned opening 20a that exposes fuse portion 14a', e.g., of at least one of the plurality of wiring structures in region 13a. FIG. 4B shows a cross-sectional view of the mask 20 along line "B"-"B" of FIG. 4A. In more specific embodiments, the mask 20 can be patterned to form opening 20a to expose the fuse portion 14a' (e.g., central portion) of a selected wiring structure in region 13a while covering the end portions 14 and a fuse portion 14a of other wiring structures in region 13a (e.g., portions that have already underwent ion implantation process described with respect to FIGS. 3A and 3B). The mask 20 can also cover the wiring structures 17, 17a in region 13b. In embodiments, the wiring structure 17a has been implanted with dopant and the wiring structure 17 has not been implanted with the dopant. The patterning to form openings 20a can be provided by any direct write lithography such as e-beam lithography prior to an amorphizing or oxidizing implant that extends through the selected wiring structures in fuse portion 14a'.

The exposed fuse portion 14a' can undergo an implant process that introduces a gas, such as a noble gas, oxidizer, or semiconductor, as shown by arrows 22. In embodiments, the gas can be argon, e.g., implanted at 30 KeV, 1E14 dose on low energy, with a high throughput implanter. It should be understood, though, that other gases or implants can be used to amorphize or oxidize the semiconductor material 12c of the exposed fuse portion 14a', effectively increasing the electrical resistance of the selected wiring structure in region 14a'. For example, the gases can be Xe, Kr, etc., a semiconductor such as Si or Ge, or an oxidizer such as oxygen (O) can be used to provide a high electrical resistance area. In this way, the wiring structures comprise low electrical resistance end portions 14 electrically connecting to a higher electrical resistance fuse 14a', effectively creating a metal-free fuse structure.

In embodiments, the fuse portion 14b in region 13a is not subjected to the implant process. By blocking the implant process in this region, the fuse portion 14b comprises crystalline semiconductor material with a different resistance, e.g., lower, than the electrical resistance of fuse region 14a'. In embodiments, the crystalline semiconductor material can be doped or undoped. In this way, the processes described herein can be used to create low electrical resistance metal-free fuses with different electrical characteristics. In alternative embodiments, the fuse region 14a' can be removed using, for example, Focused Ion Beam (FIB) processes. In this way, the fuse region 14a' would have a different electrical resistance than the remaining portions of the wiring structure, hence it would be considered from an electrical standpoint as being "blown".

Figure 5:
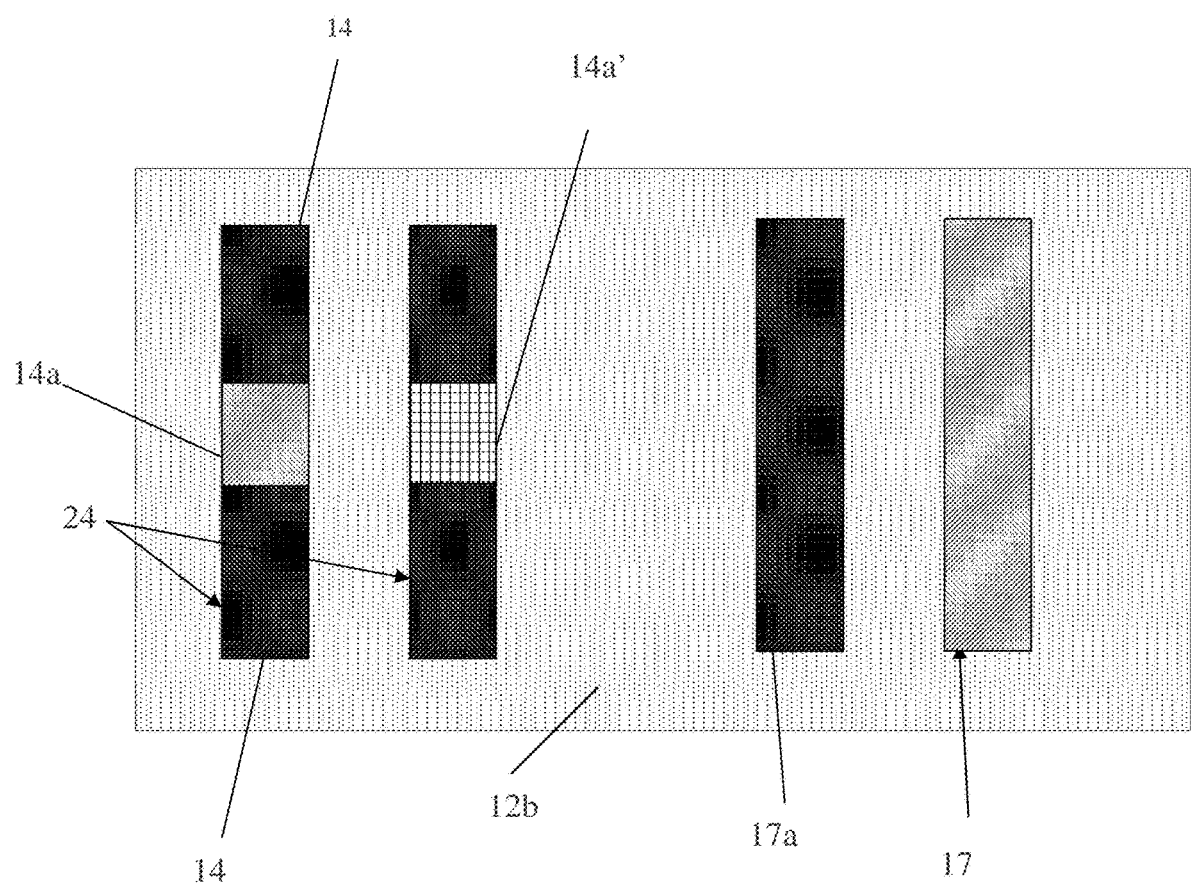
FIG. 5 shows a top view of metal-free fuse structures in accordance with aspects of the present disclosure.

FIG. 5 shows a top view of the metal-free fuse structures designated by reference numeral 24. The metal-free fuse structures 24 include different high electrical resistance fuse portions 14a, 14a', each of which are electrically connected to the low electrical resistance end portions 14. In embodiments, the high electrical resistance fuse portions 14a, 14a' can be of different electrical resistance, depending on whether or not they were implanted with the noble gas, e.g., argon, or underwent ion implantation processes. For example, the high electrical resistance fuse portion 14a can have a lower resistance than the high electrical resistance fuse portion 14a' due to the high electrical resistance fuse portion 14a' being implanted with a noble gas, e.g., argon. And, it should be further understood by those of skill in the art, that the high electrical resistance fuse portions 14a, 14a' can have different electrical resistances based on the materials used and whether it was subjected to the ion implant process described with respect to FIGS. 4A and 4B.

By way of further examples, the high electrical resistance fuse portions 14a' can be non-crystalline semiconductor material (e.g., amorphous Si material) used in high electrical resistance metal-free fuses; whereas, in further implementations, the high electrical resistance fuse portions 14a, 14a' can comprise crystalline semiconductor material used in high electrical resistance metal-free fuses. In further embodiments, the electrical resistance fuse portions 14a, 14a' can be undoped or lightly doped with the dopant species (e.g., p-type dopant, e.g., Boron (B), or n-type dopants, e.g., Arsenic (As), Phosphorus (P) and Sb, among other suitable examples) described above to provide a different electrical resistances to the metal-free fuse structures 24, e.g., higher electrical resistance with no dopant and lower electrical resistance with lightly doped material. As to the latter example, the end portions 14 would be more heavily doped than the higher electrical resistance fuse portions 14a, 14a'. In further embodiments, depending on the respective dosages/concentrations and implants, the metal-free fuse structures 24 can have different characteristics, with some metal-free fuse structures 24 having, e.g., 10X higher electrical resistance than other, lower electrical resistance metal-free fuse structures 24.

In alternative fabrication processes, a section between the end portions 14 can be left undoped to form a high resistance fuse or doped to form a low resistance fuse. This embodiment uses doping or the presence or absence of doping in the fuse center region 14a to form low (unblown) or high (blown) resistance fuses. The different dopant concentrations can be used to effectively create different electrical resistances within the wiring structure, along its length, creating a metal-free fuse structure composed entirely of the semiconductor material. For example, the end portions 14 can be more heavily doped than the fuse portions 14a hence resulting in a lower electrical resistance for the end portions of the metal-free fuse structure in region 13a.

By way of a further illustrative example, the metal-free fuse structures 24 can have a 100 nm pitch with a 300 nm length and a fuse area of 0.03 $\mu m^2$; although other dimensions are also contemplated herein. Moreover, in one illustrative, non-limiting example, the metal-free fuse structures 24 can be an array of metal-free fuse structures 24 used for a 7 digit wafer or chip identification, wherein 5 e-fuse bits can be used per character resulting in 35 metal-free fuse structures 24 at an exemplary area size of 1.1 $\mu m^2$. The array of metal-free fuse structures 24 can also include other information, e.g., parametric test information. In further embodiments, the metal-free fuse structures 24 can be used in many different applications ranging from a polysilicon gate FET over shallow trench isolation (oxide) in CMOS applications, GaN high-electron-mobility transistor (HEMT) applications, and bipolar junction or heterojunction bipolar applications comprising polysilicon emitters, amongst other applications.

Figure 6:
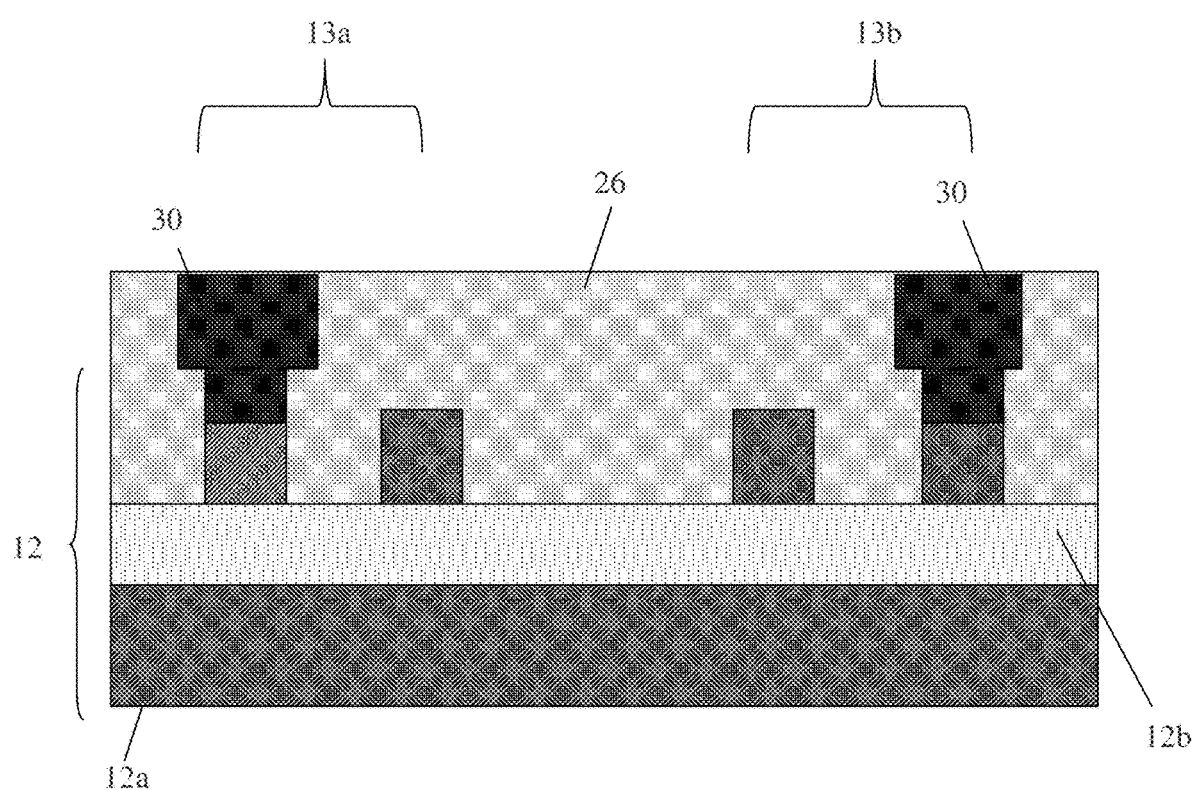
FIG. 6 shows a cross-sectional view of contacts, amongst other features, and respective fabrication processes in accordance with aspects of the present disclosure.

FIG. 6 shows a cross-sectional view of conductive or metal contacts, amongst other features, and respective fabrication processes. More specifically, an insulator material 26, e.g., intermetal dielectric material, may be formed over the metal-free wiring structures (and fuses) in regions 13a, 13b. In embodiments, the intermetal dielectric material can be e.g., plasma enhanced CVD (PECVD) $SiO_2$.

Vias are formed in the insulator material 26 using conventional lithography and etching processes known in the art. Metallization features 30 are deposited within the vias to form metallized vias and wires 30. In embodiments, the metallized vias and wires 30 can be a damascene tungsten via and wire or damascene tungsten via and aluminum sub-etch wire. Damascene or dual damascene copper vias and wires are also contemplated. A dielectric passivation, e.g., $SiO_2$, SiN, and/or polyimide, can be formed above the metallized wires and vias 30, with a wire bond, solder bump, Cu pillars connecting to the wires and vias 30. A patterned opening in the dielectric 26 around one or more of the active wiring structures in region 13b allow for microfluidic or other MEMS structures.

The metal-free fuse structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a first metal-free fuse structure comprising a top semiconductor material of semiconductor-on-insulator (SOI) technologies, the top semiconductor material including end portions with a first electrical resistance and a fuse portion of a second, higher electrical resistance electrically connected to the end portions; and
    a second metal-free fuse structure comprising the top semiconductor material of semiconductor-on-insulator (SOI) technologies, the top semiconductor material of the second metal-free fuse structure including at least a fuse portion of a lower electrical resistance than the second, higher electrical resistance.

2. The structure of claim 1, wherein the top semiconductor material comprises a top silicon layer of semiconductor-on-insulator material.

3. The structure of claim 1, wherein the end portions of the first metal-free fuse comprise crystalline material and the fuse portion of the first metal-free fuse comprises amorphous semiconductor material.

4. The structure of claim 1, wherein the fuse portion of the first metal-free fuse comprises polysilicon material.

5. The structure of claim 1, wherein the fuse portion of the first metal-free fuse comprise undoped material.

6. The structure of claim 1, wherein the end portions and the fuse portion of the first metal-free fuse comprise doped material, with the end portions being more heavily doped material than the fuse portion.

7. The structure of claim 1, wherein the fuse portion of the second metal-free fuse comprises crystalline semiconductor material.

8. The structure of claim 1, wherein the fuse portion of the first metal-free fuse comprise one of an oxidizer, a noble gas and a semiconductor material.

9. The structure of claim 1, wherein the end portions and the fuse portion of the second metal-free fuse comprise crystalline material, with the end portions more heavily doped than the fuse portion.

10. The structure of claim 1, wherein the top semiconductor material comprises silicon wires formed on a same level as the first metal-free fuse and the second metal-free fuse.

11. The structure of claim 10, wherein the silicon wires comprise one of n-type material, p-type material, and undoped material.

12. The structure of claim 1, wherein the first metal-free fuse structure comprises a doped central portion and the second metal-free fuse structure comprises an undoped central portion.

13. A structure comprising:
    at least two metal-free wiring structures comprising a top semiconductor material of semiconductor-on-insulator substrate, the at least two metal-free wiring structures comprising end portions with a lower electrical resistance than a mid-portion.

14. The structure of claim 13, wherein the end portions of the at least two metal-free wiring structures comprise crystalline semiconductor material and the mid-portion of a first metal-free wiring structure of the at least two metal-free wiring structures comprise non-crystalline semiconductor material.

15. The structure of claim 14, wherein the mid-portion comprises undoped material and the end portions comprise doped material.

16. The structure of claim 14, wherein the mid-portion of a second metal-free wiring structure of the at least two metal-free wiring structures comprise the crystalline semiconductor material.

17. The structure of claim 13, wherein the mid-portion and the end portions comprise doped material, with the end portions more heavily doped material than the mid-portion.

18. The structure of claim 13, wherein the at least two metal-free wiring structures comprise different electrical resistance values at the mid-portion.

19. A structure comprising:
    a first metal-free wiring structure comprising a top layer of semiconductor material of a semiconductor-on-insulator substrate, the first metal-free wiring structure comprising a first electrical resistance; and
    a second metal-free wiring structure composed of the top semiconductor material of the semiconductor-on-insulator substrate, the second metal-free wiring structure comprising a second electrical resistance less than the first electrical resistance.

20. The structure of claim 19, wherein:
    the first metal-free wiring structure comprises doped crystalline end regions and a crystalline center region; and
    the second metal-free wiring structure comprises doped crystalline end regions and a non-crystalline center region.

* * * * *